United States Patent
Li

(10) Patent No.: US 9,892,940 B2
(45) Date of Patent: Feb. 13, 2018

(54) SPRAY ASSEMBLY AND WET ETCHING DEVICE HAVING THE SAME

(71) Applicant: Shenzhen China Star Optoelectronics Technology Co., Ltd., Guangdong (CN)

(72) Inventor: Jia Li, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 191 days.

(21) Appl. No.: 14/781,137

(22) PCT Filed: Jul. 8, 2015

(86) PCT No.: PCT/CN2015/083503
§ 371 (c)(1),
(2) Date: Sep. 29, 2015

(87) PCT Pub. No.: WO2017/000320
PCT Pub. Date: Jan. 5, 2017

(65) Prior Publication Data
US 2017/0140950 A1    May 18, 2017

(30) Foreign Application Priority Data
Jun. 29, 2015   (CN) .......................... 2015 1 0368699

(51) Int. Cl.
*B05B 1/20* (2006.01)
*H01L 21/67* (2006.01)
(Continued)

(52) U.S. Cl.
CPC ...... *H01L 21/6708* (2013.01); *B05B 13/0278* (2013.01); *B05B 15/08* (2013.01); *H01L 21/6715* (2013.01); *B05B 1/20* (2013.01)

(58) Field of Classification Search
CPC ........... H01L 21/6708; H01L 21/67075; B05B 15/08; B05B 1/3026; B05B 13/0278; B05B 1/20; B05B 1/202
(Continued)

(56) References Cited

U.S. PATENT DOCUMENTS 5,967,418 A * 10/1999 MacDonald .............. B41F 7/30
239/391
6,478,241 B1 * 11/2002 Guo ....................... B05B 1/1672
239/242
(Continued)

*Primary Examiner* — Jason Boeckmann
(74) *Attorney, Agent, or Firm* — Mintz Levin Cohn Ferris Glovsky and Popeo, P.C.; Kongsik Kim

(57) ABSTRACT

A spray assembly including a spray pipe with a bottom provided with a plurality of first through holes, each having a nozzle, wherein the nozzle includes a slider with an area larger than the first through hole, to cover the first through hole. The nozzle is connected to the slider and protrudes from the first through hole; the nozzle also includes a locking member to connect the slider to the spray pipe. The slider can move to adjust the position of the nozzle in the first through hole. There also provides a wet etching device including a spray unit, wherein the spray unit includes a plurality of spray assemblies as mentioned above, and a plurality of spray pipes in the plurality of spray assemblies are arranged in parallel with each other or approximately in parallel with each other.

19 Claims, 5 Drawing Sheets

(51) Int. Cl.
*B05B 13/02* (2006.01)
*B05B 15/08* (2006.01)

(58) Field of Classification Search
USPC .................... 239/556, 562, 563, 564, 566
See application file for complete search history.

(56) References Cited

U.S. PATENT DOCUMENTS

| | | | | |
|---|---|---|---|---|
| 7,708,207 | B2* | 5/2010 | Grace | B08B 3/022 |
| | | | | 239/1 |
| 2002/0179745 | A1* | 12/2002 | Dolan | B05B 1/202 |
| | | | | 239/556 |
| 2014/0150829 | A1* | 6/2014 | Tibell | B08B 3/022 |
| | | | | 134/34 |
| 2015/0034733 | A1* | 2/2015 | Grace | B05B 1/20 |
| | | | | 239/11 |

* cited by examiner

SPRAY ASSEMBLY AND WET ETCHING DEVICE HAVING THE SAME

CROSS-REFERENCE TO RELATED APPLICATION

This application is the U.S. national phase of PCT Application No. PCT/CN2015/083503 filed on Jul. 8, 2015, which claims priority to CN Patent Application No. 201510368699.1 filed on Jun. 29, 2015, the disclosures of which are incorporated in their entirety by reference herein.

TECHNICAL FIELD

The present invention relates to semiconductor manufacturing process technical field, particularly to a spray assembly and a wet etching device having the same.

BACKGROUND ART

Wet etching process is widely used in the manufacturing process of a Thin Film Transistor Liquid Crystal Display (TFT-LCD). With continuously updating of various manufacturing processes of LCD panel, a TFT array substrate has more kinds of metal wires, and from aluminum process to copper process and silver process, wet etching process has an important effect on performance and yield of products. The wet etching device mainly has two etching modes: a dip mode and a spray mode; the procedure of etching pattern in the dip mode may be easily controlled, while the etching rate in the spray mode is faster. In the spray mode, etching solution is sprayed onto a surface of an object to be processed through a spray assembly, and the higher the spraying pressure is, the faster the etching rate is.

FIG. 1 is a structural schematic diagram of an existing spray assembly used in the wet etching device. As shown in FIG. 1, the spray assembly 1 includes a spray pipe 1a and a plurality of nozzles 1b connected to the bottom of the spray pipe 1a, and the plurality of nozzles 1b are arranged at equal intervals and fixedly connected with the spray pipe 1a by means of welding. The etching solution flows in from the spray pipe 1a and then is sprayed onto the surface of the object to be processed from the nozzles 1b. FIG. 2 is an exemplary diagram of the wet etching device having the above mentioned spray assembly. As shown in FIG. 2, the wet etching device includes a spray unit 2 which includes a plurality of spray assemblies 1, in which a plurality of spray pipes 1a are arranged in parallel with each other and at equal intervals, and the nozzles 1b connected to the spray pipes 1a are distributed in array. An object-to-be-processed 3 (e.g., a glass substrate on which a metal thin film layer is deposited) is transferred to below the spray unit 2 from a direction (X direction) perpendicular to or approximately perpendicular to the length of the spray pipe 1a, and the nozzles 1b spray etching solution to the surface of the object-to-be-processed 3 for etching.

In the wet etching device as configured above, the nozzles 1b and the spray pipe 1a are fixedly connected by means of welding, and the spray unit 2 composed thereof is also single and fixed. When a nonuniform etching occurs at local in the etching process, all of the spray assemblies 1 (including the spray pipes 1a and the nozzles 1b) in the device need to be replaced, causing an increase in production cost.

SUMMARY

To this end, the present invention provides a spray assembly and a wet etching device having the same. The nozzles and spray pipes in the spray assembly are detachably connected, thus when a nonuniform etching occurs at local in the etching process, the uniformity of the spray can be improved by adjusting the position of the nozzle, thereby improving production efficiency and lowering the cost.

To achieve the above purpose, the present invention adopts the following technical solution:

a spray assembly includes a spray pipe of which the bottom is provided with a plurality of first through holes, a nozzle mechanism is assembled in each of the first through holes, wherein the nozzle mechanism includes a slider of which the area is larger than that of the first through hole, and the slider is provided in the spray pipe and covers on the first through hole; a nozzle is connected to the slider and protrudes from the first through hole, and the nozzle is in fluid communication with the spray pipe; the nozzle mechanism also includes a locking member to connect the slider to the spray pipe, and the slider is fixedly connected to the spray pipe when the locking member is locked; the slider can move in a horizontal plane when the locking member is loosened, to adjust the position of the nozzle in the first through hole.

A stuck slot is provided at a side of the slider toward the first through hole, a stuck-point raised toward the slider is provided at an edge of the first through hole, and the stuck-point is assembled in the stuck slot.

A second through hole is provided on the slider, and the nozzle is detachably connected to the second through hole.

The second through hole is a threaded hole, and the nozzle has a first thread part mated with the threaded hole, such that the nozzle is detachably connected to the second through hole by assembling the first thread part in the threaded hole.

The locking member is a thread locking member including a bolt and a thread through hole or thread blind hole provided on the slider, the bolt is assembled in the thread through hole or thread blind hole through the first through hole, and the width of a head of the bolt is greater than that of the first through hole.

The locking member is a thread locking member including a bolt and a nut, and a third through hole is provided on the slider, the bolt passes through the third through hole and the first through hole sequentially to mate with the nut, and the width of the nut is greater than that of the first through hole.

The number of the thread locking members is at least two, which are located on opposite sides of the nozzle respectively.

The plurality of first through holes are arranged on the bottom of the spay pipe at equal intervals.

The present invention also provides a wet etching device including a spray unit, wherein the spray unit includes a plurality of spray assemblies as mentioned above, and a plurality of spray pipes in the plurality of spray assemblies are arranged in parallel with each other or approximately in parallel with each other.

In the plurality of spray assemblies of the spray unit, according to the arrangement direction of the spray assemblies, the nozzle in the odd number spray assembly is located much closer to a first end of the first through hole, and the nozzle in the even number spray assembly is located much closer to a second end opposite to the first end of the first through hole.

The advantageous effects are as follows:

the present invention provides a spray assembly and a wet etching device having the same. Nozzles and spray pipes in the spray assembly are detachably connected, thus when a nonuniform etching occurs at local in the etching process, the uniformity of the spray can be improved by adjusting the connection position of the nozzle, thereby improving production efficiency and lowering the cost.

DETAILED DESCRIPTION OF EXEMPLARY EMBODIMENTS

Hereinafter, the technical solutions in embodiments of the present invention will be described in detail in conjunction with the attached drawings and the detailed embodiments. Obviously, the described embodiments are only a part of embodiments of the present invention, not all embodiments. Based on the embodiments in the present invention, all other embodiments acquired by those of ordinary skill in the art without exerting any creative work fall into the protection scope of the present invention.

Figure 1:
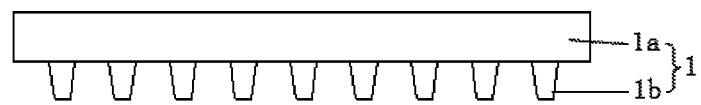
FIG. 1 is a structural schematic diagram of an existing spray assembly used in a wet etching device.
Figure 2:
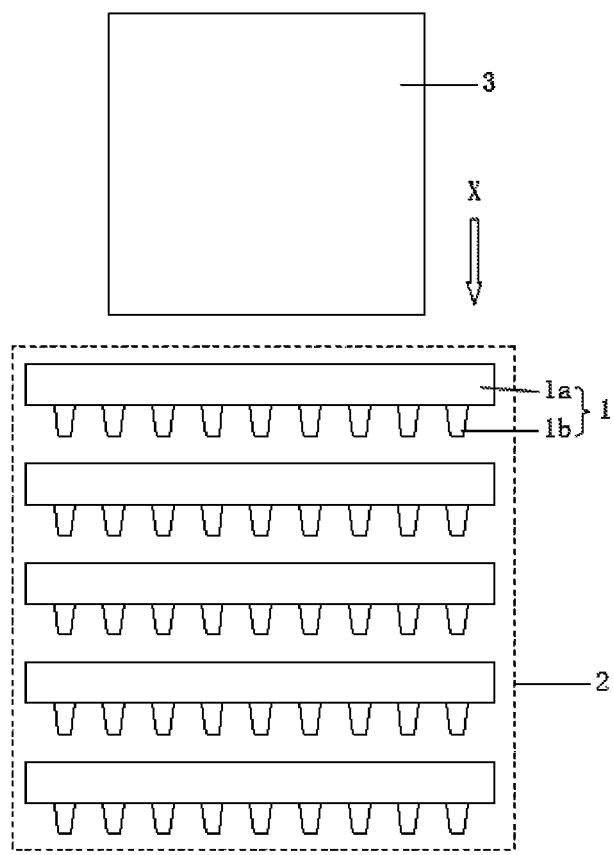
FIG. 2 is an exemplary diagram of the wet etching device having the spray assembly as shown in FIG. 1.
Figure 3:
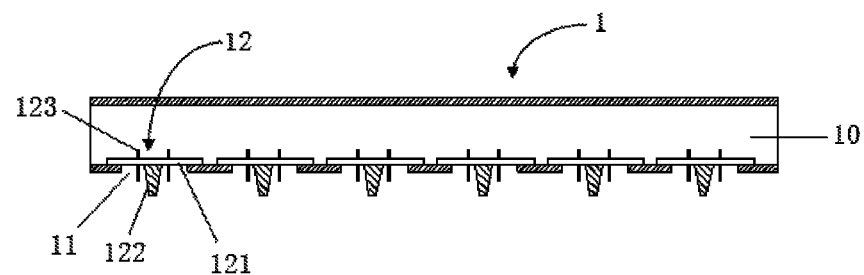
FIG. 3 is a structural schematic diagram of the spray assembly provided in an embodiment of the present invention.

The present embodiment firstly provides a spray assembly. Referring to FIG. 3, the spray assembly 1 includes a spray pipe 10 of which the bottom is provided with a plurality of first through holes 11, and a nozzle mechanism 12 is assembled in each of the first through holes 11. The nozzle mechanism 12 includes a slider 121 of which the area is larger than that of the first through hole 11, and the slider 121 is provided in the spray pipe 10 and covers on the first through hole 11. A nozzle 122 is connected to the slider 121 and protrudes from the first through hole 11, and the nozzle 122 is in fluid communication with the spray pipe 10. The nozzle mechanism 12 also includes a locking member 123 to connect the slider 121 to the spray pipe 10, and the slider 121 is fixedly connected to the spray pipe 10 when the locking member 123 is locked; and the slider 121 can move in a horizontal plane when the locking member 123 is loosened, to adjust the position of the nozzle 122 in the first through hole 11. Furthermore, the plurality of first through holes 11 are arranged on the bottom of the spay pipe 10 at equal intervals.

Figure 4:
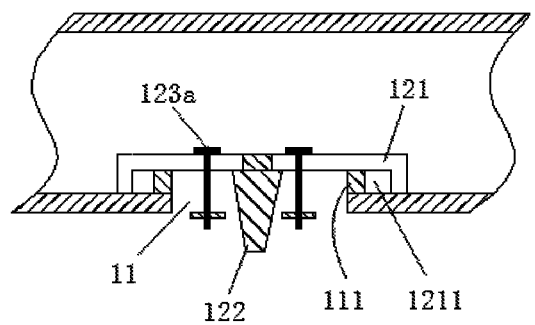
FIG. 4 is a schematic diagram of the connection structure of nozzle mechanism and spray pipe in an embodiment of the present invention.

In particular, referring to FIG. 4, in order to prevent the range of movement of the slider 121 in the horizontal plane from being too large (it is likely that the slider 121 does not completely cover the first through hole 11, causing solution leakage), a stuck slot 1211 is provided at a side of the slider 121 toward the first through hole 11, a stuck-point 111 raised toward the slider 121 is provided at an edge of the first through hole 11, and the stuck-point 111 is assembled in the stuck slot 1211. After providing the stuck-point 111 and the stuck slot 1211, the movement of the slider 121 in the horizontal plane is blocked by the stuck-point 111, thus an edge of the slider 121 cannot be moved into the first through hole 11. In order to enable the slider 121 to move in a relatively larger range, widths of the stuck slot 1211 in horizontal and vertical directions should be several times greater than that of the stuck-point 111.

In addition, the moving range of the slider 121 can be adjusted by adjusting the sizes of the slider 121, the first through hole 11, the stuck slot 1211 and the stuck-point 111, but not specifically defined herein.

Figure 5:
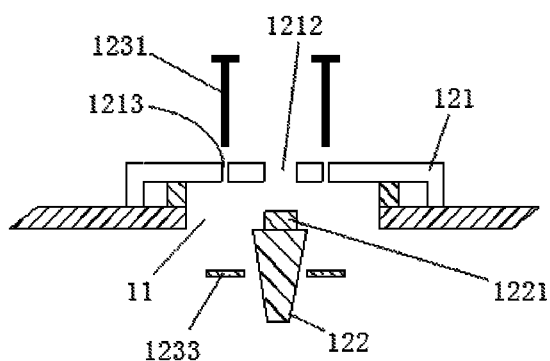
FIG. 5 is an exploded schematic diagram of the connection structure as shown in FIG. 4.

In particular, referring to FIGS. 4-5, a second through hole 1212 is provided on the slider 121, and the nozzle 122 is detachably connected to the second through hole 1212. In the present embodiment, the second through hole 1212 is a threaded hole, and the nozzle 122 has a first thread part 1221 mated with the threaded hole, such that the nozzle 122 is detachably connected to the second through hole 1212 by assembling the first thread part 1221 in the threaded hole. Further, a sealing structure such as a sealing ring can be added to the connection portion of the nozzle 122 and the second through hole 1212, to thereby prevent liquid in the spray pipe 10 from leaking out.

It is understandable that the nozzle 122 can also be fixedly connected to the slider 121 by other methods such as welding or integrated molding, so as to move as the slider 121 slides, and this fixed connection method can more effectively prevent the liquid in the spray pipe 10 from leaking out.

Figure 6:
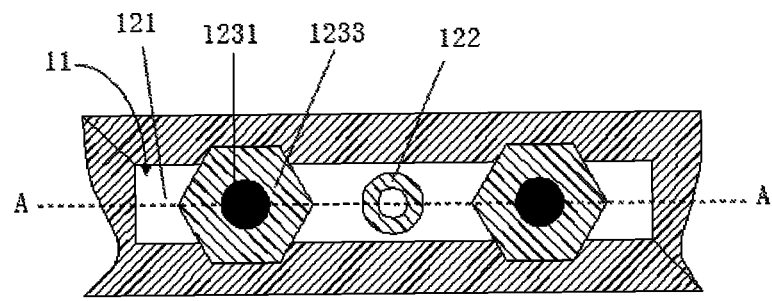
FIG. 6 is a bottom view of the connection structure as shown in FIG. 4.

Particularly, referring to FIGS. 4-6, in which FIG. 6 is a bottom view of the connection structure of the nozzle mechanism and the spray pipe, FIG. 4 is a cross-sectional view taken in A-A line of the connection structure as shown in FIG. 6, and FIG. 5 is an exploded schematic diagram of the connection structure as shown in FIG. 4. In the present embodiment, the locking member 123 is a thread locking member 123a including a bolt 1231 and a nut 1233, and a third through hole 1213 is provided on the slider 121, the bolt 1231 passes through the third through hole 1213 and the first through hole 11 sequentially to mate with the nut 1233, and as shown in FIG. 6, the width of the nut 1233 is greater than that of the first through hole 11. The slider 121 can be moved when the bolt 1231 and the nut 1233 are loosened; and after the slider 121 is moved to the desired position, the bolt 1231 and the nut 1233 are tightened up to fasten the slider 121 to the bottom of the spray pipe 10. More particularly, in the present embodiment, there are two thread locking members 123a, which are located on opposite sides of the nozzle 122 respectively. In another embodiment, more thread locking members 123a can be provided.

Figure 7:
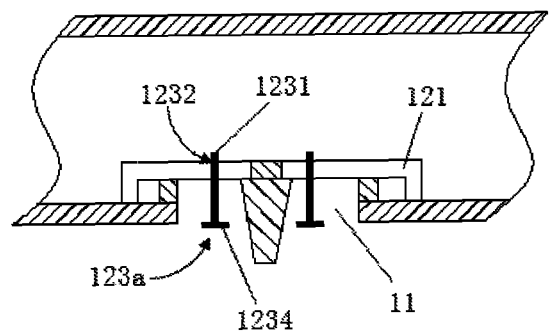
FIG. 7 is a schematic diagram of the connection structure of nozzle mechanism and spray pipe in another embodiment.
Figure 8:
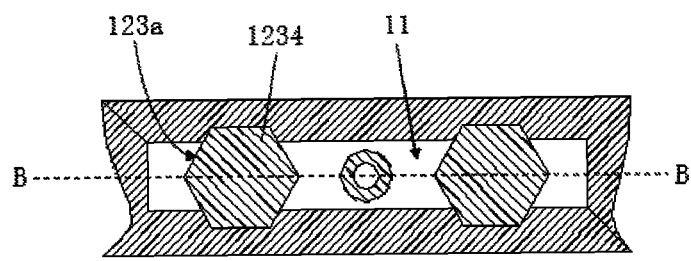
FIG. 8 is a bottom view of the connection structure as shown in FIG. 7.

Regarding the thread locking member 123a, it can be provided in such a way as shown in FIGS. 7-8 in some other embodiments. Referring to FIGS. 7-8, in which FIG. 8 is a bottom view of the connection structure of the nozzle mechanism and the spray pipe in this embodiment, and FIG. 7 is a cross-sectional view taken in B-B line of the connection structure as shown in FIG. 8. The thread locking member 123a includes a bolt 1231 and a thread through hole or thread blind hole 1232 (which is shown as a through hole in FIG. 7) provided on the slider 121, the bolt 1231 is assembled in the thread through hole or thread blind hole 1232 through the first through hole 11, and the width of a head 1234 of the bolt 1231 is greater than that of the first through hole 11.

Figure 9:
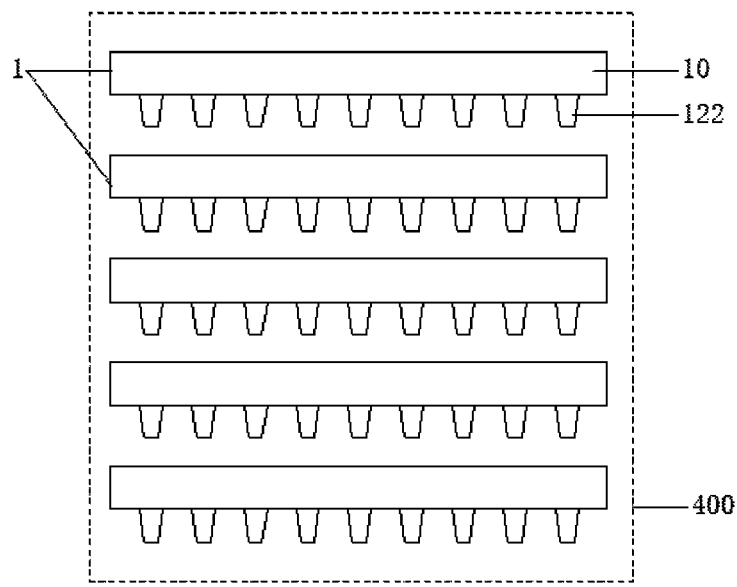
FIG. 9 is an exemplary diagram of the wet etching device having the spray assembly as shown in FIG. 3.

The spray assembly 1 as provided above is applied to a wet etching device. Referring to FIG. 9, the wet etching device at least includes a spray unit 400 which includes a plurality of spray assemblies 1 as provided above, and a plurality of spray pipes 10 in the plurality of spray assemblies 1 are arranged in parallel with each other or approximately in parallel with each other. As shown in FIG. 9, in the spray unit 400, a plurality of nozzles 122 is distributed in array.

In the wet etching device as provided above, the nozzle and the spray pipe in the spray assembly are detachably connected, thus when a nonuniform etching occurs at local in the etching process or part of the nozzles in the spray unit are damaged, only partial nozzles need to be replaced.

Furthermore, in the spray unit 400 as shown in FIG. 9, the nozzles 122 in each spray assembly 1 are located at the same position in the first through holes 11, and the plurality of nozzles 122 are distributed in square array, which may cause the spraying between two columns of nozzles nonuniform.

Figure 10:
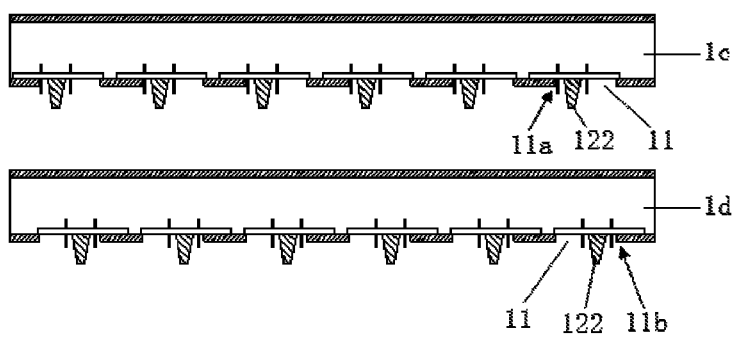
FIG. 10 is an exemplary diagram of a different assembly method of the spray assembly provided in an embodiment of the present invention.
Figure 11:
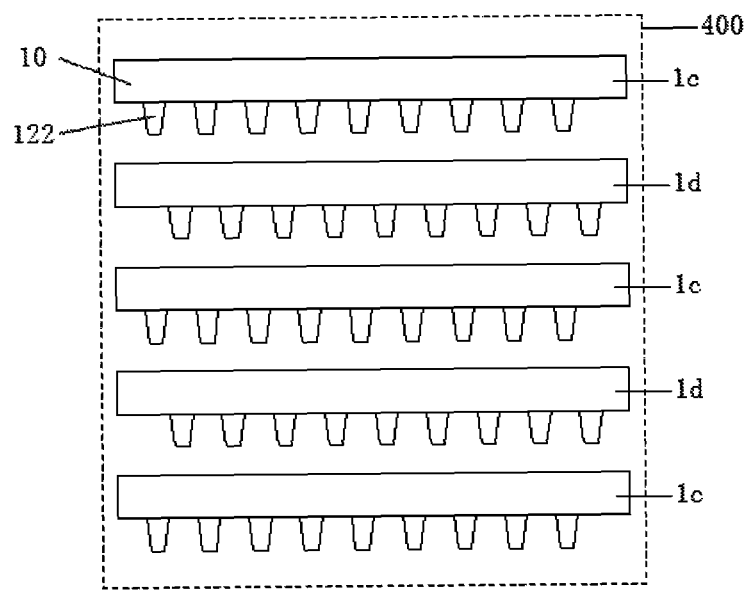
FIG. 11 is an exemplary diagram of the wet etching device having the spray assembly as shown in FIG. 10.

To improve uniformity of the spraying, referring to FIGS. 10 and 11, in another preferred embodiment, the spray assemblies 1 are divided into a first kind of spray assembly 1c and a second kind of spray assembly 1d. In particular, as shown in FIG. 10, in the first kind of spray assembly 1c, the position where the nozzle 122 is located in the first through hole 11 is much closer to a first end 11a of the first through hole 11. However, in the second kind of spray assembly 1d, the position where the nozzle 122 is located in the first through hole 11 is much closer to a second end 11b of the first through hole 11. Herein, the meaning of "much closer" is understood from a view of comparing the first kind of spray assembly 1c and the second kind of spray assembly 1d. The difference between the first kind of spray assembly 1c and the second kind of spray assembly 1d only lies in the arrangement position of the nozzles 122. If the first kind of spray assembly 1c and the second kind of spray assembly 1d are applied to the wet etching device, as shown in FIG. 11, the first kind of spray assembly 1c and the second kind of spray assembly 1d are arranged staggerly in the spray unit 400 of the wet etching device. For instance, in the present embodiment, the first kind of spray assembly 1c is on odd row, and the second kind of spray assembly 1d is on even row. In the resulting spray unit 400, a plurality of nozzles 122 are distributed in array, and by taking the length direction of the spray pipe 10 as a row, and taking the direction perpendicular to the length direction of the spray pipe 10 as a column, the nozzles 122 on neighboring rows are staggered with each other, such that the nozzles 122 on the neighboring rows (between the first kind of spray assembly 1c and the second kind of spray assembly 1d) are on different columns, and the nozzles 122 on alternate rows (between two first kind of spray assemblies 1c and between two second kind of spray assemblies 1d) are on the same column.

In the spray unit as provided above, the nozzles on the neighboring rows are staggered with each other, which improves the uniformity of the spraying, and has advantage to improve quality of etching process.

It should be explained that the relationship terms, such as first and second, etc., in the present text are only used for distinguishing one entity or operation from another entity or operation without requiring or implying any actual relation or sequence existing between these entities or operations. Moreover, the terms "include", "contain" or any other variant thereof are intended to cover nonexclusive inclusion, so that the process, method, object or device including a series of factors not only includes those factors but also includes other factors that are not explicitly listed or includes factors inherent in this process, method, object or device. In the absence of more limitations, factors defined by the sentence "include one . . . " do not exclude additional identical factors existing in the process, method, object or device which includes the factors.

Obviously, the protection scope of the present invention is not limited to the above detailed modes of carrying out the invention, and those skilled in the art may make various changes and modifications to the present invention without departing from the scope and spirit of the invention. As such, if these changes and modifications of the present invention belong to the scope of the claims of the present invention and equivalent technologies thereof, the present invention is also intended to include these changes and modifications herein.

The invention claimed is:

1. A spray assembly comprising a spray pipe of which the bottom is provided with a plurality of first through holes, a nozzle mechanism is assembled in each of the first through holes, wherein:
the nozzle mechanism comprises a slider of which the area is larger than that of the first through hole, and the slider is provided in the spray pipe and covers the first through hole; a nozzle is connected to the slider and protrudes from the first through hole, and the nozzle is in fluid communication with the spray pipe;
the nozzle mechanism also comprises a locking member to connect the slider to the spray pipe, and the slider is fixedly connected to the spray pipe when the locking member is locked; and the slider can move in a horizontal plane when the locking member is loosened, to adjust the position of the nozzle in the first through hole.

2. The spray assembly of claim 1, wherein a stuck slot is provided at a side of the slider toward the first through hole, a stuck-point raised toward the slider is provided at an edge of the first through hole, and the stuck-point is assembled in the stuck slot.

3. The spray assembly of claim 1, wherein a second through hole is provided on the slider, and the nozzle is detachably connected to the second through hole.

4. The spray assembly of claim 3, wherein the second through hole is a threaded hole, and the nozzle has a first thread part mated with the threaded hole, such that the nozzle is detachably connected to the second through hole by assembling the first thread part in the threaded hole.

5. The spray assembly of claim 1, wherein the locking member is a thread locking member comprising a bolt and a thread through hole or thread blind hole provided on the slider, the bolt is assembled in the thread through hole or thread blind hole through the first through hole, and the width of a head of the bolt is greater than that of the first through hole.

6. The spray assembly of claim 5, wherein the number of the thread locking members is at least two, which are located on opposite sides of the nozzle respectively.

7. The spray assembly of claim 1, wherein the locking member is a thread locking member comprising a bolt and a nut, a third through hole is provided on the slider, the bolt passes through the third through hole and the first through hole sequentially to mate with the nut, and the width of the nut is greater than that of the first through hole.

8. The spray assembly of claim 7, wherein the number of the thread locking members is at least two, which are located on opposite sides of the nozzle respectively.

9. The spray assembly of claim 1, wherein the plurality of first through holes are arranged on the bottom of the spay pipe at equal intervals.

10. A wet etching device comprising a spray unit which comprises a plurality of spray assemblies, the spray assemblies comprising a spray pipe of which the bottom is provided with a plurality of first through holes, and a nozzle mechanism being assembled in each of the first through holes, wherein:
the nozzle mechanism comprises a slider of which the area is larger than that of the first through hole, and the slider is provided in the spray pipe and covers the first through hole; a nozzle is connected to the slider and protrudes from the first through hole, and the nozzle is in fluid communication with the spray pipe;
the nozzle mechanism also comprises a locking member to connect the slider to the spray pipe, and the slider is fixedly connected to the spray pipe when the locking member is locked; and the slider can move in a horizontal plane when the locking member is loosened, to adjust the position of the nozzle in the first through hole;
wherein a plurality of spray pipes in the plurality of spray assemblies are arranged in parallel with each other or approximately in parallel with each other.

11. The wet etching device of claim 10, wherein a stuck slot is provided at a side of the slider toward the first through hole, a stuck-point raised toward the slider is provided at an edge of the first through hole, and the stuck-point is assembled in the stuck slot.

12. The wet etching device of claim 10, wherein a second through hole is provided on the slider, and the nozzle is detachably connected to the second through hole.

13. The wet etching device of claim 12, wherein the second through hole is a threaded hole, and the nozzle has a first thread part mated with the threaded hole, such that the nozzle is detachably connected to the second through hole by assembling the first thread part in the threaded hole.

14. The wet etching device of claim 10, wherein the locking member is a thread locking member comprising a bolt and a thread through hole or thread blind hole provided on the slider, the bolt is assembled in the thread through hole or thread blind hole through the first through hole, and the width of a head of the bolt is greater than that of the first through hole.

15. The wet etching device of claim 14, wherein the number of the thread locking members is at least two, which are located on opposite sides of the nozzle respectively.

16. The wet etching device of claim 10, wherein the locking member is a thread locking member comprising a bolt and a nut, a third through hole is provided on the slider, the bolt passes through the third through hole and the first through hole sequentially to mate with the nut, and the width of the nut is greater than that of the first through hole.

17. The wet etching device of claim 16, wherein the number of the thread locking members is at least two, which are located on opposite sides of the nozzle respectively.

18. The wet etching device of claim 10, wherein the plurality of first through holes are arranged on the bottom of the spay pipe at equal intervals.

19. The wet etching device of claim 10, wherein in the plurality of spray assemblies of the spray unit, according to the arrangement direction of the spray assemblies, the nozzle in the odd number spray assembly is located much closer to a first end of the first through hole, and the nozzle in the even number spray assembly is located much closer to a second end opposite to the first end of the first through hole.

* * * * *